United States Patent
Wang et al.

(10) Patent No.: US 8,598,039 B2
(45) Date of Patent: Dec. 3, 2013

(54) BARRIER LAYER REMOVAL METHOD AND APPARATUS

(75) Inventors: Jian Wang, Shanghai (CN); Zhaowei Jia, Shanghai (CN); Junping Wu, Shanghai (CN); Liangzhi Xie, Shanghai (CN); Hui Wang, Shanghai (CN)

(73) Assignee: ACM Research (Shanghai) Inc. (CN)

( * ) Notice: Subject to any disclaimer, the term of this patent is extended or adjusted under 35 U.S.C. 154(b) by 235 days.

(21) Appl. No.: 13/059,814

(22) PCT Filed: Aug. 20, 2008

(86) PCT No.: PCT/CN2008/072059
§ 371 (c)(1),
(2), (4) Date: Apr. 11, 2011

(87) PCT Pub. No.: WO2010/020092
PCT Pub. Date: Feb. 25, 2010

(65) Prior Publication Data
US 2011/0177692 A1    Jul. 21, 2011

(51) Int. Cl.
*H01L 21/302* (2006.01)
(52) U.S. Cl.
USPC .......... 438/704; 438/689; 438/706; 438/710; 438/720; 257/E21.31; 257/E21.303
(58) Field of Classification Search
None
See application file for complete search history.

(56) References Cited

U.S. PATENT DOCUMENTS

| | | | |
|---|---|---|---|
| 5,254,202 A | 10/1993 | Kaplan | |
| 6,207,570 B1 | 3/2001 | Mucha | |
| 7,422,700 B1 | 9/2008 | Hardikar | |
| 2004/0080053 A1* | 4/2004 | Wang et al. | 257/774 |
| 2004/0188385 A1 | 9/2004 | Yamada et al. | |
| 2006/0189134 A1* | 8/2006 | Cotte et al. | 438/687 |
| 2006/0276030 A1* | 12/2006 | Wang et al. | 438/631 |
| 2008/0102631 A1 | 5/2008 | Andryushchenko et al. | |
| 2009/0001587 A1 | 1/2009 | Cotte et al. | |

FOREIGN PATENT DOCUMENTS

| | | |
|---|---|---|
| CN | 1523647 A | 8/2004 |
| CN | 1543668 A | 11/2004 |
| CN | 1788330 A | 6/2006 |
| JP | 08-097214 | 4/1996 |
| JP | 10-223608 | 8/1998 |
| JP | 11-135797 | 5/1999 |
| JP | 2000-311899 A | 11/2000 |
| JP | 2003-243391 A | 8/2003 |
| JP | 2004-221261 A | 8/2004 |
| JP | 2004-527126 A | 9/2004 |
| JP | 2004-276219 A | 10/2004 |
| JP | 2006-511699 A | 4/2006 |

(Continued)

*Primary Examiner* — Lan Vinh
*Assistant Examiner* — Jiong-Ping Lu
(74) *Attorney, Agent, or Firm* — Howard C. Miskin; Gloria Tsui-Yip (57) ABSTRACT

This invention relates to a method and apparatus by integrating semiconductor manufacturing processes of stress free electrochemical copper polishing (SFP), removal of the Tantalum oxide or Titanium oxide formed during SFP process and $XeF_2$ gas phase etching barrier layer Ta/TaN or Ti/TiN process. Firstly, at least portion of plated copper film is polished by SFP. Secondly the barrier metal oxide film formed during SFP process is etched away by etchant. Finally, the barrier layer Ta/TaN or Ta/TiN is removed with $XeF_2$ gas phase etching. The apparatus accordingly consists of three sub systems: stress free copper electropolishing system, barrier layer oxide film removal system and barrier layer Ta/TaN or Ti/TiN gas phase etching system.

12 Claims, 9 Drawing Sheets

(56) References Cited

FOREIGN PATENT DOCUMENTS

| TW | 512455 B | 12/2002 |
| TW | 200506098 A | 2/2005 |
| WO | 01/99181 A2 | 12/2001 |
| WO | 03/017330 A2 | 2/2003 |
| WO | WO 2008/013402 A1 | 1/2008 |

* cited by examiner

Post-SFP Sample:
Etched by using XeF2 without pretreatment of Ta oxide removal

Pin hole

FIG 8

Post-SFP Sample: Etched by strong etchant

Sidewall damage of barrier layer (Ta/TaN)

FIG 9

Post-SFP Sample:
Etched by using XeF2 with pretreatment of Ta oxide removal

BARRIER LAYER REMOVAL METHOD AND APPARATUS

FIELD OF INVENTION

The present invention generally relates to semiconductor processing methods and apparatus, and more specifically, relates to integration of the processing including: stress free copper polishing and selective barrier removal process. Even more specifically, the invention relates to the process that may be used effectively to selectively remove copper and Ta/TaN or Ti/TiN layer stress-freely during the fabrication of an integrated device and that are compatible with low k dielectric materials.

RELATED ART

Semiconductor devices are manufactured or fabricated on semiconductor wafers using a number of different processing steps to create transistor and interconnection elements. To electrically connect transistor terminals associated with the semiconductor wafer, conductive (e.g., metal) trenches, vias, and the like are formed in dielectric materials as part of the semiconductor device. The trenches and vias couple electrical signals and power between transistors, internal circuit of the semiconductor devices, and circuits external to the semiconductor device.

In forming the interconnection elements, the semiconductor wafer may undergo, for example, masking, etching, and deposition processes to form the semiconductor transistors and desired electronic circuitry to connect those transistor terminals. In particular, multiple masking, ion implantation, annealing, plasma etching, and chemical and physical vapor deposition steps can be performed to form shallow trench, transistor well, gate, poly-silicon line, and interconnection line structures.

Conventional methods of removing the metal film deposited on the non-recessed areas of the dielectric layer on the semiconductor wafer include, for example, chemical mechanical polishing (CMP). CMP methods are widely used in the semiconductor industry to polish and planarize the metal layer within the trenches and vias with the non-recessed areas of the dielectric layer to form interconnection lines. In a CMP process, a wafer assembly is positioned on a CMP pad located on a platen or web. The wafer assembly includes a substrate having one or more layers and/or features, such as interconnection elements formed in a dielectric layer. A force is then applied to press assembly against the CMP pad. The CMP pad and the substrate assembly are moved against and relative to one another while applying the force to polish and planarize the surface of the wafer. A polishing solution, often referred to as polishing slurry, is dispensed on the CMP pad to facilitate the polishing. The slurry typically contains an abrasive and is chemically reactive to selectively remove from the wafer unwanted materials, for example, a metal layer, more rapidly than other materials, for example, a dielectric material.

CMP methods, however, can have several deleterious effects on the underlying semiconductor structure because of the relatively strong mechanical forces involved. For example, as interconnection geometries move to 0.13 microns and below, there exists a large difference between the mechanical properties of the conductive materials, for example copper and low k films used in typical damascene processes. For instance, the Young Modulus of a low k dielectric film maybe greater than 10 orders of magnitude lower than that of copper and/or barrier material. Consequently, the relative strong mechanical force applied on the dielectric films and copper/barrier layer in a CMP process can cause permanent damage to the low k dielectric.

Another alternative method for removing metal films deposited on the non-recessed areas of the dielectric layer is electropolishing. The electrochemical copper polishing system can remove copper with high uniformity and have high selectivity to Ta/TaN barrier layer. It is a mechanical stress free process. However barrier can not be electropolished due to the formation of Tantalum oxide or Titanium oxide.

One example to remove Ta/TaN is to use HF wet etching to etching Ta/TaN. However the HF will damage the most dielectric layer after Ta/TaN being removed.

Sood, et al, "Wet etching of sputtered tantalum thin films in NaOH and KOH based solutions", 2007, J Mater Sci: Mater Electron, 18, 535-539, discloses the use of $KOH/H_2O_2$ or $NaOH/H_2O_2$ based solution to etch Tantalum thin films. A strong base like KOH or NaOH speeds up the dissolution of Tantalum. However, the both NaOH and KOH will etch and damage Copper in the trench.

IBM patent disclose: An exemplary newly desired processing technique is using $XeF_2$ gas phase etching to remove barrier materials such as Tantalum, Tantalum nitride, Titanium, and Titanium nitride after CMP Cu process.

SUMMARY

This invention relates to a method and apparatus for processing a semiconductor structure of the type including a substrate, a dielectric layer, a Ta/TaN or Ti/TiN barrier layer on the dielectric layer, and a thin copper film on the barrier layer. In the preferred embodiments, the present invention is to integrate the processes including: stress free electrochemical copper polishing (SFP) process, removal of the tantalum oxide or Titanium oxide formed during SFP process, and finally removing barrier layer Ta/TaN or Ti/TiN by using $XeF_2$.

Firstly, the plated copper film is polished by SFP technology. The present invention uses SFP copper polishing as alternatives to copper Chemical Mechanical Polishing (CMP) as a basic "metal polishing process" at BEOL. This is a chemical-electrical process: the copper on the wafer substrate is as anode and the electrolyte nozzle is cathode. The copper is polished by the contacted electrolyte when a positive voltage is applied between the anode and the cathode. When copper film above barrier is electro-polished, and exposed Ta or Ti barrier layer is passivated by forming a stable tantalum oxide or Titanium oxide film on the surface.

The tantalum oxide or Titanium oxide has very high chemical stability. And it works as a protection of the barrier layer during copper polishing, but it makes the removal of barrier layer more difficult in the following process. $XeF_2$ gas can etch Ta/TaN or Ti/TiN efficiently, but it etches tantalum oxide or Titanium oxide very slowly and under some condition, does not etch at all. In order to remove the barrier effectively and preventing the mask effect caused by Tantalum oxide or Titanium oxide, the present invention uses etchant to remove the tantalum oxide or Titanium oxide on the barrier layer surface prior to removing Ta/TaN or Ti/TiN by using $XeF_2$. There are kinds of etchant that etches the Tantalum oxide or Titanium oxide film on the barrier layer surface, for example, HF and buffered HF (BHF), KOH, NaOH, citric acid and oxalic acid. Besides the embodiments of the etchant mentioned above, $CF_4/O_2$ plasma and Argon sputtering method can also be used to remove the Tantalum oxide or Titanium oxide film on the surface of barrier layer.

Finally, the barrier layer Ta/TaN or Ti/TiN is removed by XeF$_2$ gas phase etching. The present invention uses XeF$_2$ gas phase etching as the alternatives to conventional Ta/TaN or Ti/TiN chemical mechanical polishing as a basic barrier removal process. The whole process is stress free and has no mechanical damage neither to low k material nor to the device structure.

Further benefits and advantages of the invention will become apparent from a consideration of the following detailed description and the accompanied drawings.

DETAILED DESCRIPTION

The present invention, generally, relates to methods and apparatus for processing semiconductor devices. More specially, the invention relates to processes for removing or etching barrier layers, such as Ta/TaN, and barrier layer is compatible with low k dielectric materials. This in turn facilitates the use of low k dielectric materials for various applications in semiconductor devices.

Shown in FIGS. 1 to 4 is a novel integration process comprising: using a stress-free electrochemical method to remove copper; using etchant to remove the tantalum oxide formed during the copper removal process and using selective XeF$_2$ gas phase etching to remove the barrier layer Ta/TaN. Neither electrochemical polishing of copper nor tantalum oxide removal process nor the XeF$_2$ barrier layer removal processes has mechanical stress. This integrated process minimizes mechanical degradation of the structure, minimizes the mask effect caused by the Tantalum oxide, minimizes chemical modification of the structure and minimizes the loss of low k dielectric.

Figure 1:
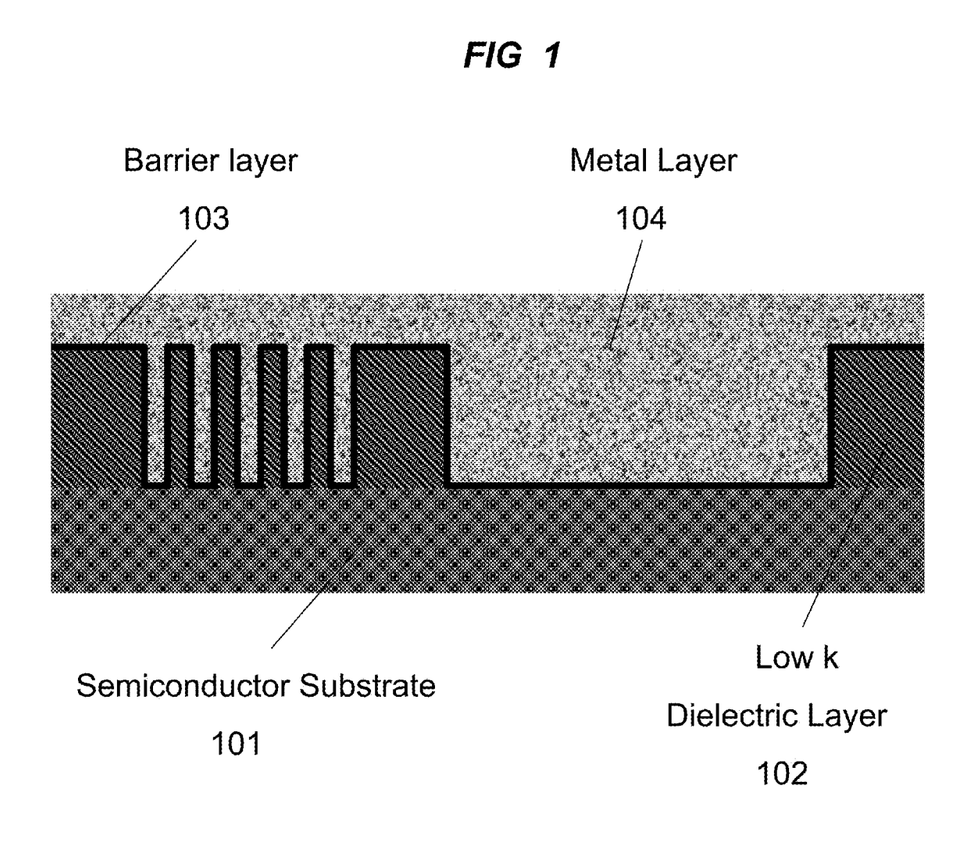
FIG. 1 is a cross-sectional view of interconnect structure before electrochemical copper stress-free polishing (SFP)

Shown in FIG. 1 is an exemplary profile of a copper damascene structure. The semiconductor structure includes a dielectric layer, usually a low k dielectric layer 102 formed over a wafer substrate or previously semiconductor device structure 101. According to an embodiment, the low k dielectric layer has a dielectric constant greater than 1.2 and less than 4.2. The structure may further include a barrier layer 103 on the low k dielectric layer 102, usually Ta/TaN and other materials known in the art. The structure includes a pattern of the trenches and/or vias separated by dielectric layer 102. Metal or copper layer 104 on the barrier layer 103 is formed over the structure filing the recessed regions and formed over the non-recessed regions. The planar surface topology of the copper or metal layer 104 located over structures in barrer layer 103 and dielectric layer 102 can be plated by using a flat plating method with dummy structure as disclosed in patent application with the application No. PCT/US03/11417, or can be electro-polished with contacting pad nozzle disclosed in U.S. provisional application with the Ser. No. 60/738,250, both of which have been assigned to the applicant and are cooperated herein by reference.

Figure 2:
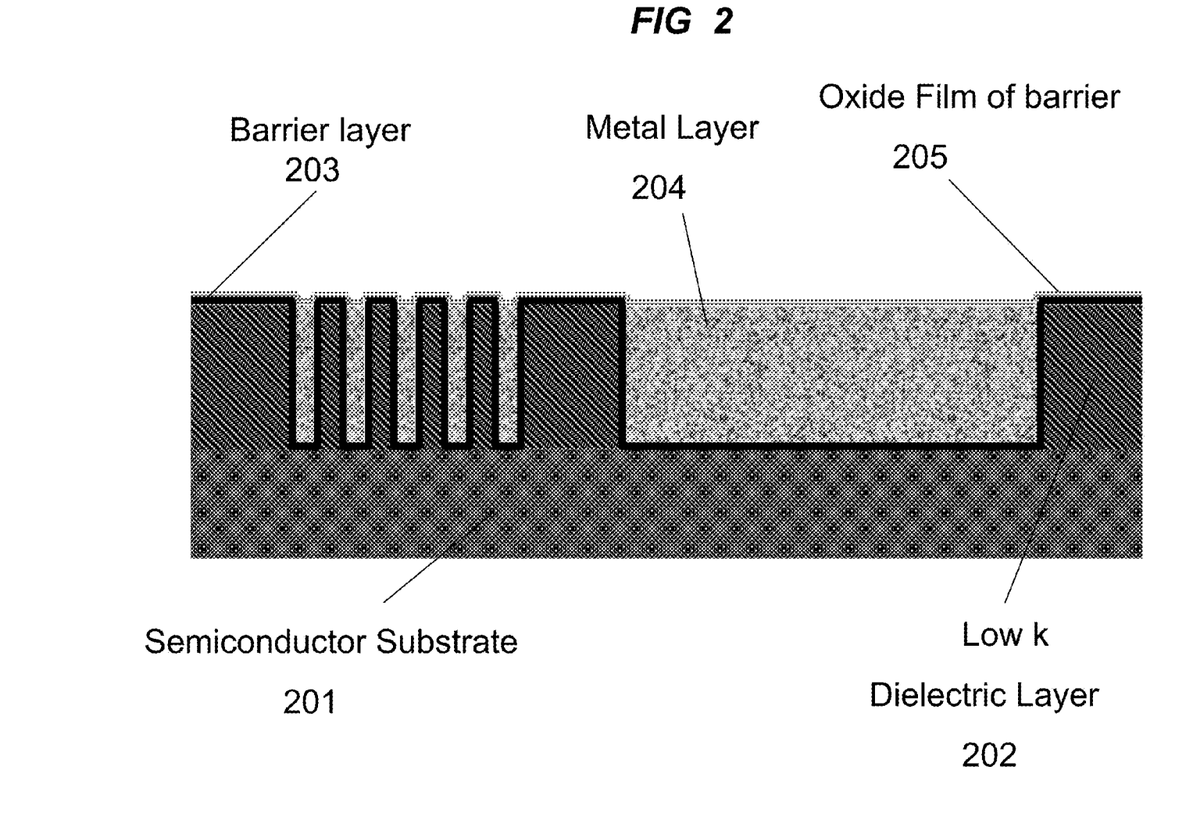
FIG. 2 is a cross-sectional view of interconnect structure after SFP process remove copper. The Tantalum oxide film is formed on the barrier layer during SFP process.
Figure 5:
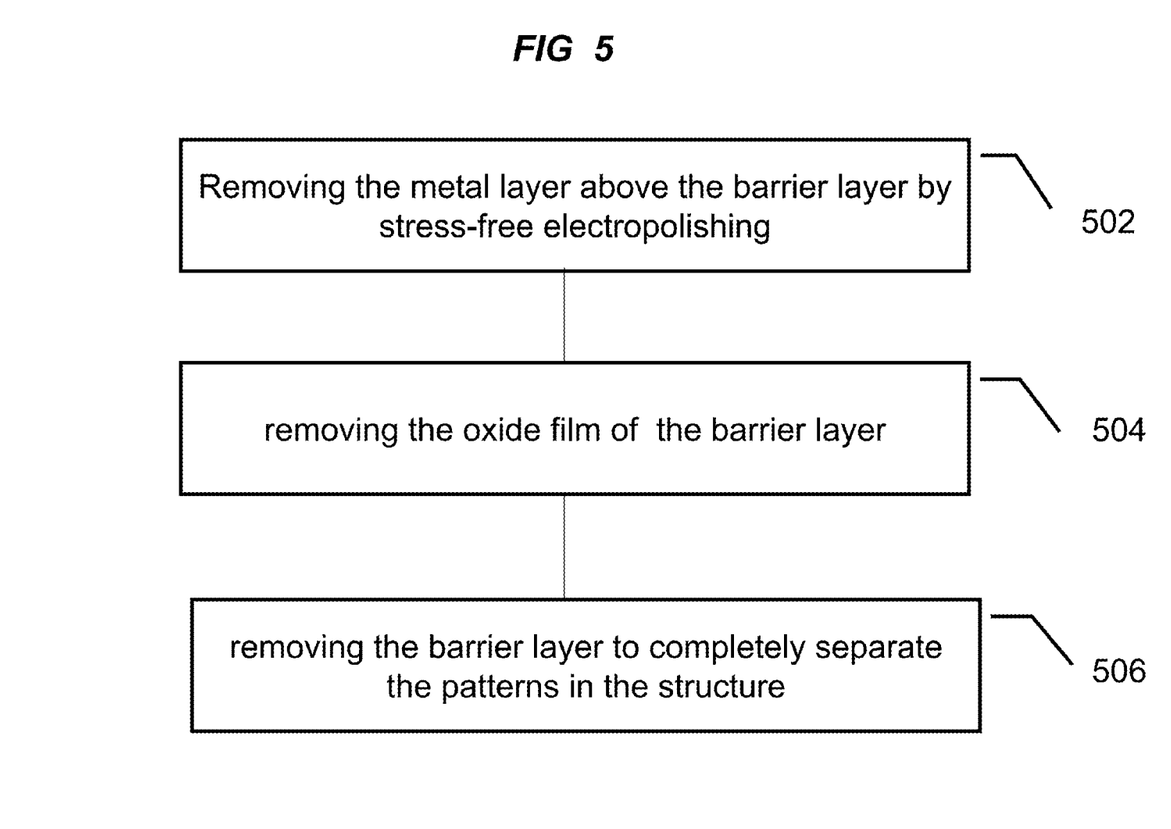
FIG. 5 is a flow chart of an exemplary process of the present invention.

A stress-free electropolishing (SFP) is performed to the metal layer 204 (step 502 in FIG. 5). FIG. 2 illustrates the structure after an electropolihsing process. Metal or copper layer 204 is typically polished back to the surface of non-recessed areas such that metal layer within the recessed regions, i.e., the trenches and/or vias, is isolated from adjacent recessed regions. This is a chemical-electrical process: the copper on the wafer substrate is as anode and the electrolyte nozzle is cathode. The copper is dissolved and polished by the contacted electrolyte when positive voltage is applied between the anode and the cathode. This is a stress free and selective copper removal process. The barrier layer 203 which is a Ta/TaN layer is passivated by forming a stable Tantalum oxide film 205 on the surface. The Tantalum oxide film 205 on the surface of barrier Ta/TaN layer 203 makes it difficult to remove the barrier layer 203 in the following processes.

The Tantalum oxide film 205 on the tantalum surface consists of two parts: one part is native oxide caused by exposing in the air. Tantalum oxide, with exceptional stability, is formed on Ta when Ta is exposed in the air. Various tantalum oxides, including TaO, Ta$_2$O, TaO$_2$, Ta$_2$O$_5$ and Ta$_2$O$_7$ can form depending electron valence, but only Ta$_2$O$_5$ is thermodynamically stable in the presence of water.

The other but more important part is caused by anodic oxidation in the SFP process. During copper anodic dissolution process the electrochemical reaction of Ta at the electrode can be described as:

$$2Ta + 5H_2O = Ta_2O_5 + 10H^+ + 10e^-$$

Figure 7:
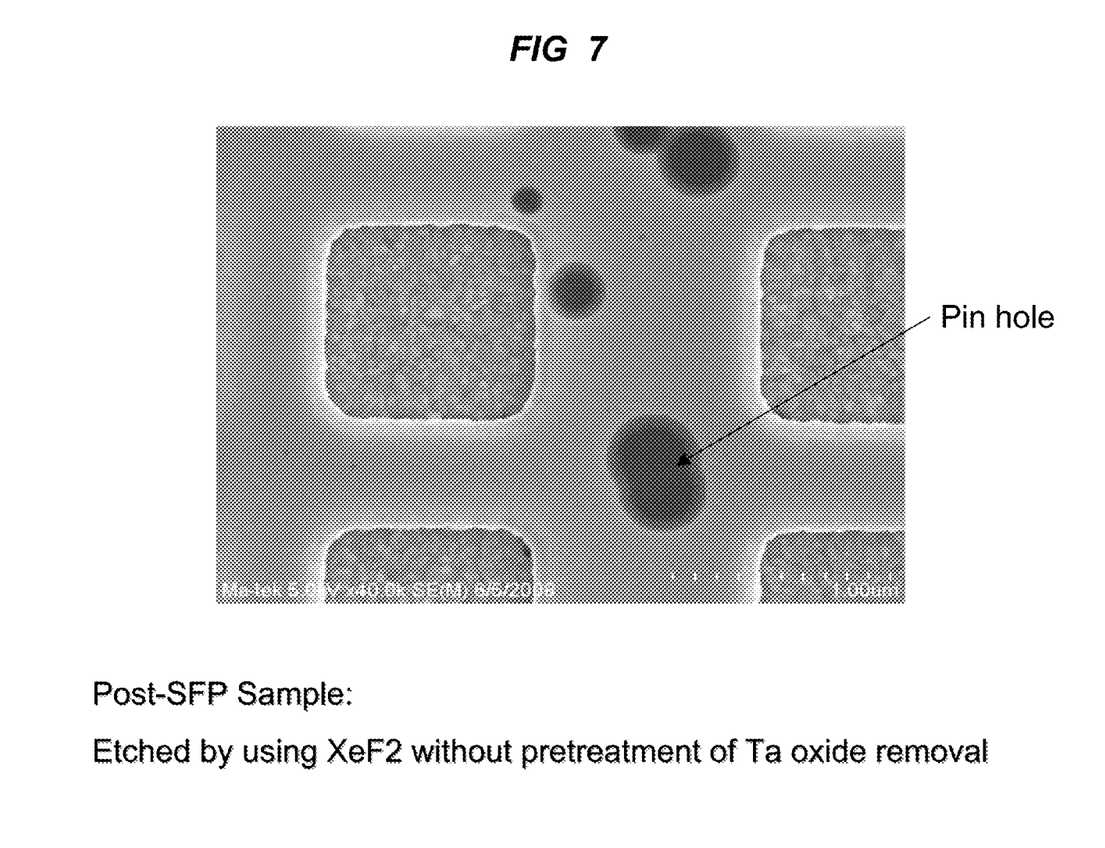
FIG. 7, is a SEM top view of Post-SFP sample. The sample is etched by using XeF2 without pretreatment of Tantalum oxide removal.

Due to the water in the electrolyte of the copper electropolishing process, after the copper polishing, the tantalum oxide is dominantly tantalum pentoxide. The tantalum pentoxide has very high chemical stability. It works as a protection of the barrier layer during copper polishing, but it makes the removal of barrier layer more difficult in the following step. XeF$_2$ gas can etch Ta and TaN 203 at a proper rate, but it hardly etches tantalum oxide 205 and does not etch at all under some condition. Tantalum oxide 205 works as mask layer to prevent Ta and TaN 203 being etched away by XeF$_2$. Extremely long time XeF$_2$ can remove portion of Ta and TaN layer, however it causes pin hole as shown in FIG. 7. FIG. 7 shows that the barrier layer Ta/TaN 203 is etched by XeF$_2$ without the Tantalum oxide film 205 removal step after copper 204 is polished by SFP. It can be seen that after XeF2 etching for a certain time, the barrier layer 203 is not removed except around the pin hole area. In order to remove the barrier effectively and uniformly, the Tantalum oxide film 205 on the barrier layer 203 surface should be removed first.

Thus, the second step shown in FIG. 5 is to remove the Tantalum oxide film of the barrier layer (step 504). The following examples are provided to illustrate various embodiments of the Tantalum oxide film removal step in this invention and are not intended to restrict the scope thereof.

The first exemplary way to remove the Tantalum oxide on top surface of the barrier layer is to treat the surface with F$^-$ containing solution of which hydrofluoric acid (HF) or buffered HF (BHF) is preferred. HF/BHF solution reacts with tantalum oxide. The reacting function, taking tantalum pentoxide as an example, is as following:

$$Ta_2O_5 + 14F^- + 10H^+ = 2TaF_7^{2-} + 5H_2O$$

Figure 8:
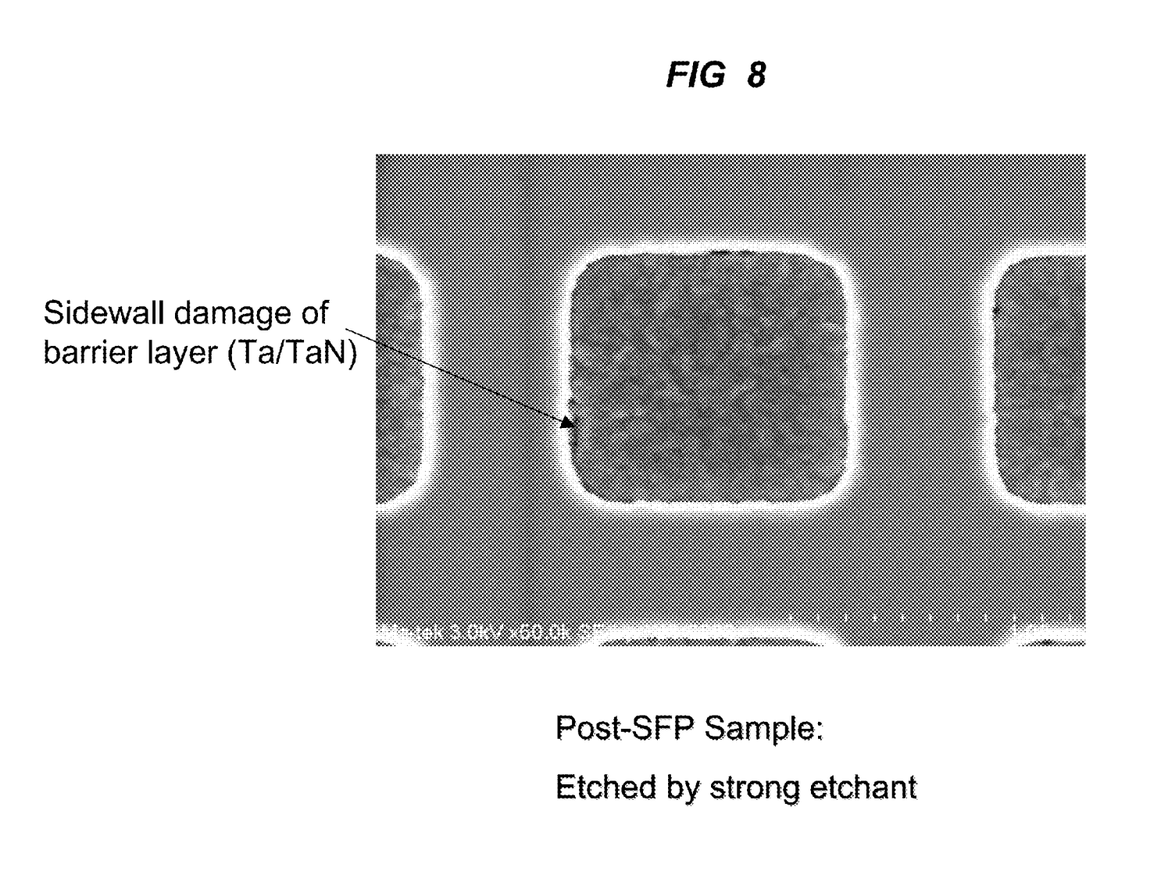
FIG. 8, is a SEM top view of Post-SFP sample. The sample is etched by using strong etchant.
Figure 9:
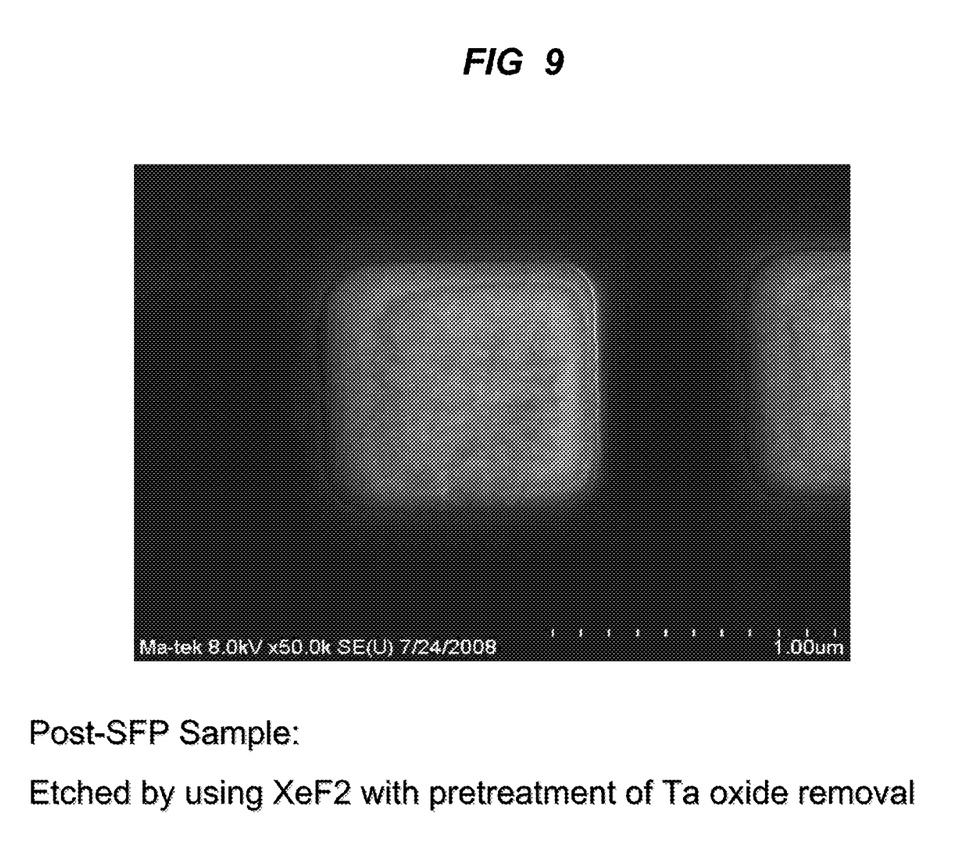
FIG. 9, is a SEM top view of Post-SFP sample. The sample is etched by using XeF2 with pretreatment of Tantalum oxide removal.

The concentration of HF/BHF is from 0.1 w % to 30 w % and 0.5%-4% is preferred. The processing temperature is from 0° C. to 50° C. and room temperature is preferred. Treatment time depends on the concentration of HF/BHF and temperature. The solution here etches the tantalum oxide film 205 and portion of the barrier layer Ta 203 and causes no damage to copper layer 204. But if the treatment is too strong, etching time too long or the etchant concentration too high, the barrier layer Ta/TaN 203 will be removed. FIG. 8 shows the barrier Ta/TaN 203 at side wall of pad will be damaged if etchant is too strong. It can be clearly seen that at least portion of the barrier layer at side wall is damaged. The low k dielectric layer 202 will be damaged by the solution therefore. An exemplary proper treatment is to etch the Ta oxide film 205. As shown in FIG. 9, after the Tantalum oxide film 205 etching, the remaining barrier layer Ta/TaN 203 is removed effectively by using XeF2 compared to that shown in FIG. 7.

The F− containing solution is not restricted to HF/BHF. Solution that contains F−, with pH value less than 7 and has no damage to copper can be used as the oxide film etchant. For example, $NH_4F$ with addition of sulphuric acid or HCl solution can also etches tantalum oxide 205. And the addition of other acid can make the removal of the tantalum oxide more effective due to the decreased pH. The removal rate of the Tantalum oxide 205 can be controlled through the concentration of F− and pH value.

The second exemplary method to remove the Tantalum oxide film is using a strong base solution. Tantalum oxide 205 can be dissolved in strong base solution by forming its mineral acid, in this case tantalic acid ($H_2Ta_2O_6$). The dissolution of $Ta_2O_5$ is accelerated at higher pH and elevated temperature. Take KOH as an example, the solution is saturate KOH in water at room temperature of which pH is higher than 10. The concentration verifies from 0.1% to 50% and 10%~40% is preferred. The temperature is from 0° C. to 90° C. and 40° C. 80° C. is preferred. The base solution has a good selectivity of the tantalum oxide film 205 etch rate to that of copper layer 204.

The third exemplary way to remove at least portion of the tantalum oxide film 205 is using en etching gas mixture containing from about 300 sccm to about 400 sccm of $CF_4$ and about 200 sccm to about 600 sccm of oxygen at a temperature from about 100° C. to about 150° C. under a pressure from about 1 torr to about 1.5 torr. The etching gas mixture is contacted with the Tantalum oxide film in the form of a plasma via a reactive ion etch (RIE) apparatus or an electron cyclotron resonance (ECR) plasma reactor. RIE apparatus and ECR plasma reactors are commercially available. A parallel plate RIE is preferred. Etching a tantalum oxide film 205 with the tantalum oxide etch gas mixture is an isotropic etch. It can remove the tantalum oxide film 205 with good uniformity.

The fourth exemplary way to remove the tantalum oxide 205 and at least portion of Ta 203 is to use gas sputtering, such as Ar gas sputtering just as the reverse of the film deposition. The sputtering is conducted using an inert gas selected from the group consisting of Ar, He, Ne, Xe and Kr but Ar is preferred. The sputtering equipment is commercially available.

The fifth exemplary way to remove the tantalum oxide 205 is using citric acid and/or oxalic acid solution as an etchant. The citric acid and/or oxalic acid removes at least portion of the tantalum oxide 205 which makes the remove of barrier layer 203 more effectively. The concentration of the acid varies from 0.1% to 10% and 5%~8% is preferred. The etching temperature is from 0° C. to 80° C. but 20° C.~60° C. is preferred.

Figure 3:
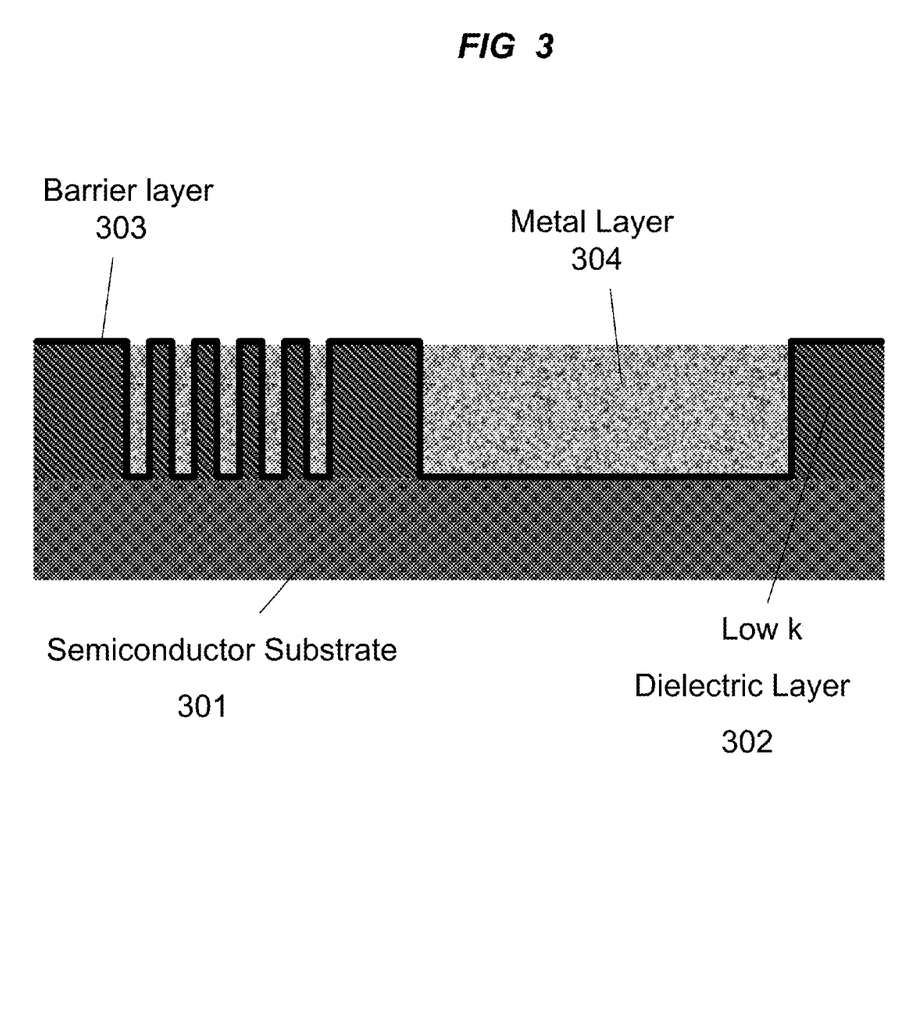
FIG. 3 is a cross-sectional view of after the Ta oxide film removed with etchant.

All of the above exemplary methods can be used to etch the Tantalum oxide films 205, but HF/BHF is preferred. As mentioned before, the examples are provided to illustrate various embodiments of the step 504 in this invention to remove at least portion of the tantalum oxide 205 and even portion of barrier layer Ta 203. After this step, the Tantalum oxide of the barrier layer 205 is removed, the Ta/TaN layer 303 and the copper layer 304 is exposed, as shown in FIG. 3.

After the removal of the tantalum oxide 205 on the surface, the residual barrier layer Ta/TaN 303 on the top surface of wafer is removed by $XeF_2$ gas phase etching (step 506 in FIG. 5). The $XeF_2$ reacts spontaneously with barrier layer Ta/TaN 303 at certain temperature and pressure. $XeF_2$ is an isotropic selective etching method of Ta/TaN 303. The $XeF_2$ gas has good selectivity to both copper 404 and dielectric materials 402, such as $SiO_2$, SiLK, and low k Si—C—O—H based materials where k varies from 1.2 to 4.2 but 1.3~2.4 is preferred. During the whole process there is no mechanical stress that is applied to the barrier layer 403 or dielectric layer 402 directly, so there is no damage to copper 404 or low k dielectric materials 402. The temperature of the substrate varies from 0° C. to 300° C. and 25° C.~200° C. is preferred. The pressure of $XeF_2$ gas during the process is between 0.1 Torr and 100 Torr but 0.5 Torr~20 Torr is preferred.

The chemical reaction products of $XeF_2$ and barrier layer Ta/TaN 303 are in gas phase, Xe e.g. or volatile at the processing pressure, for example, tantalum fluoride. There is no residual on the surface of wafer.

Figure 4:
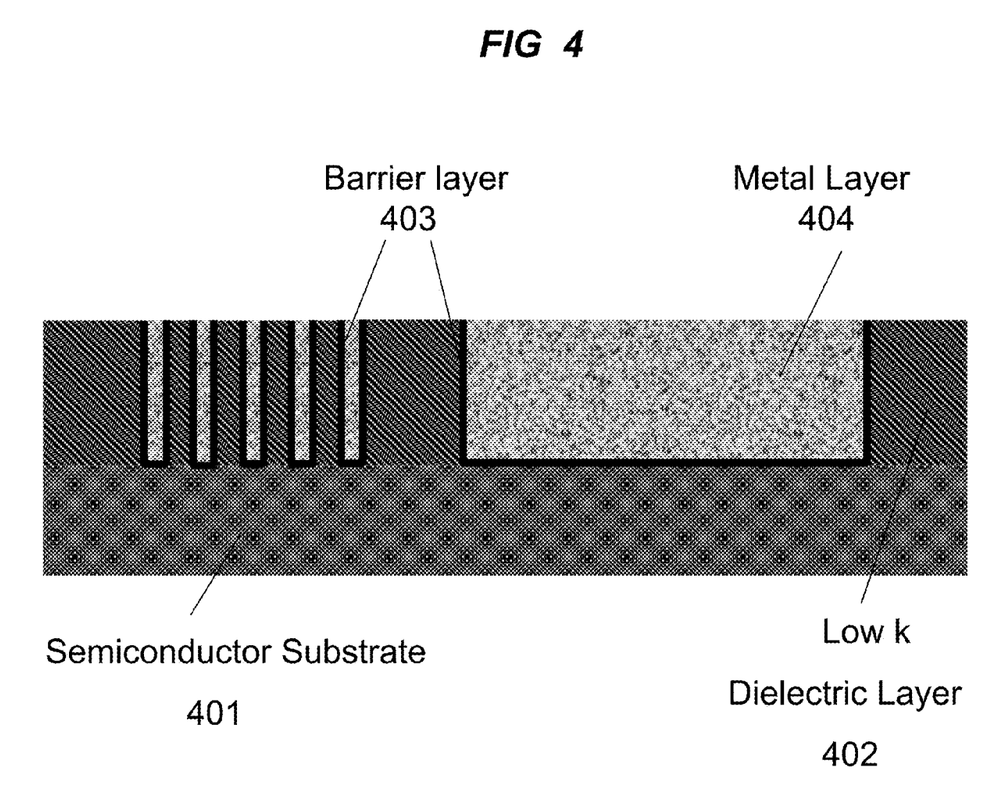
FIG. 4 is a cross-sectional view of barrier layer Ta—TaN removed by XeF$_2$ etching.

As shown in FIG. 4, when the barrier layer exposed on the top surface is removed completely by $XeF_2$ gas phase etching 506, the trenches and/or vias in the semiconductor device is electrically separated completely. The metal or copper layer 404, the barrier layer 403 are completely separated by the low k dielectric layer 402.

Figure 6:
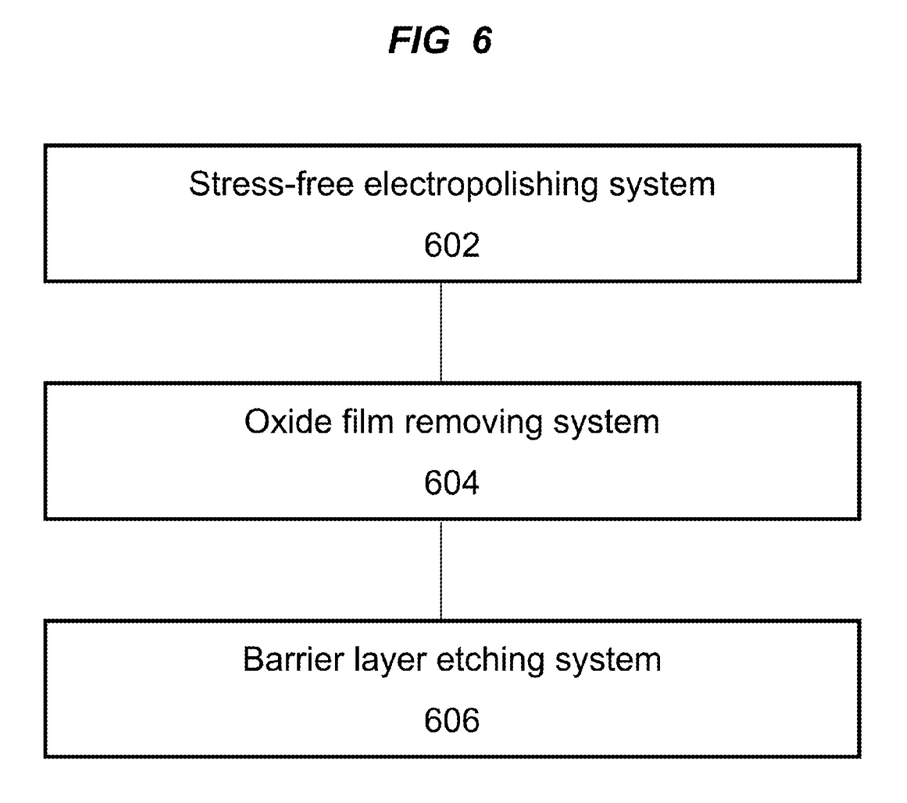
FIG. 6 is a block diagram of an exemplary apparatus of the present invention.

FIG. 6 has shown a block diagram of an exemplary apparatus of the present invention, comprising: a stress-free electropolishing (SFP) system 602, an Tantalum oxide removing system 604 and a $XeF_2$ etching system 606. The function of the blocks 602-606 correspond to the blocks 502-506 in FIG. 5 respectively.

In one exemplary embodiment, the electropolishing system includes a nozzle configured to apply a stream of electrolyte to metal layer at different radial locations on wafer. A power supply is connected to nozzle to apply a negative electropolishing charge to stream of electrolyte. Power supply is also connected to wafer to apply a positive electropolishing charge to wafer. Thus during the electropolishing process, nozzle acts as a cathode, and wafer acts as an anode. When stream of electrolyte is applied to metal layer, the difference in potential between electrolyte and metal layer results in the electropolishing of metal layer from wafer. Although power supply is depicted as being directly connected to wafer, it should be recognized that any number intervening connection can exist between power supply and wafer. For example power supply can be connected to chuck, which is then connected to wafer, and, more particular to metal layer. For additional description of electropolishing, see U.S. patent application Ser. No. 09/497,894, entitled METHOD AND APPARATUS FOR ELECTROPOLISHING METAL INTERCONNECTIONS ON SEMICONDUCTOR DEVICES, FILED ON Feb. 4, 2000, which is incorporated herein by reference in its entirety.

In one exemplary embodiment, the barrier oxide film removal system includes a rotating chuck to hold a semiconductor wafer, the rotating means to drive the chuck to rotate around an axis, a nozzle to inject the liquid etchant onto the surface of the wafer, a chamber body and a etchant delivery system. After the copper SFP process, the wafer is loaded to the chuck. The etchant is delivered and ejected on to the wafer surface after the chuck begins to rotate. The etchant distributes uniformly on the wafer surface. After etching for a period of time, the barrier oxide film on the wafer substrate is removed.

The $XeF_2$ etching system of the present invention is much like commercially available $XeF_2$ etching system for Silicon MEMS consisting of at least one pump, one etching chamber, one expansion chamber, and one solid $XeF_2$ source chamber. Between each chamber there are pneumatic throttle valves and also pressure gauges in the expansion and process etching chamber. The system can work in both pulse mode and continuous flow mode. In the continuous follow mode, the pressure is kept constant in the etching chamber so that the etching rate can be controlled. In the pulse mode, both chambers first are purged by $N_2$, and then both are evacuated. Then open the valves between solid $XeF_2$ and the expansion chamber which will be filled with $XeF_2$ gas then. Close the valve between solid source and expansion chamber and open the valve between expansion chamber and etching chamber. When it reaches a proper pressure the valve is closed. After the sample is exposed in $XeF_2$ gas for a period of time, such as 3 to 30 seconds, then $XeF_2$ is evacuated out of the etching chamber. This is called a "cycle" and can be repeated twice or more to remove at least portion of Ta/TaN barrier layer completely to the dielectric material. The $XeF_2$ etching system of the present invention is also stress-free.

Although the present invention has been described with respect to certain embodiments, examples, and applications, it will be apparent to those skilled in the art that various modifications and changes may be made without departing from the invention.

What is claimed is:

1. A method for processing a semiconductor structure, which comprises a substrate, a dielectric layer, a barrier layer on the dielectric layer, and a metal layer on the barrier layer, the structure has patterns and the metal layer fills the patterns, wherein the method comprises:
   removing the metal layer above the barrier layer by stress-free electropolishing (SFP);
   removing the Tantalum oxide or Titanium oxide film of the barrier layer formed during the stress-free electro-polishing by etching reagent, which is a solution contains HF/BHF;
   removing the barrier layer to completely separate the patterns in the structure by using $XeF_2$ gas.

2. The method of claim 1, wherein the barrier layer is selected from the group consisting of Ta, Ti as pure elements, compounds or with additions of nitrogen or silicon.

3. The method of claim 1, wherein at least portion of the Tantalum oxide or Titanium oxide film of the barrier layer is formed during stress-free electropolishing of the metal layer.

4. The method of claim 1, wherein the metal layer is copper layer.

5. The method of claim 1, wherein the dielectric layer is composed of dielectric materials having dielectric constant less than 4.2 and greater than 1.2.

6. The method of claim 1, wherein the concentration of the etching reagent varies from 0.1% to 30%, and
   the temperature is from 0° C. to 50° C., and
   the etching reagent also contains $F^-$ with addition of HCl or $H_2SO_4$.

7. The method of claim 1, wherein the pressure of the $XeF_2$ gas is between 0.1 Torr and 100 Torr.

8. The method of claim 7, wherein the temperature of the substrate is from 0° C. to 300° C.

9. A method for processing a semiconductor structure, which comprises a substrate, a dielectric layer, a barrier layer on the dielectric layer, and a metal layer on the barrier layer, the structure has patterns and the metal layer fills the patterns, wherein the method comprises:
   removing the metal layer above the barrier layer by stress-free electropolishing (SFP);
   removing the Tantalum oxide or Titanium oxide film of the barrier layer formed during the stress-free electro-polishing by etching reagent, which is a strong base solution containing KOH or NaOH or both;
   removing the barrier layer to completely separate the patterns in the structure by using $XeF_2$ gas.

10. The method of claim 9, wherein the concentration of the solution varies from 0.1% to 50%, and the temperature is from 0° C. to 90° C.

11. A method for processing a semiconductor structure, which comprises a substrate, a dielectric layer, a barrier layer on the dielectric layer, and a metal layer on the barrier layer, the structure has patterns and the metal layer fills the patterns, wherein the method comprises:
   removing the metal layer above the barrier layer by stress-free electropolishing (SFP);
   removing the Tantalum oxide or Titanium oxide film of the barrier layer formed during the stress-free electro-polishing by citric acid or oxalic acid or a mixture of the two;
   removing the barrier layer to completely separate the patterns in the structure by using $XeF_2$ gas.

12. The method of claim 11 wherein the concentration of the acid varies from 0.1% to 10%, and the temperature is from 0° C. to 80° C.

* * * * *